US005540824A

United States Patent [19]

Yin et al.

[11] Patent Number: 5,540,824

[45] Date of Patent: Jul. 30, 1996

[54] PLASMA REACTOR WITH MULTI-SECTION RF COIL AND ISOLATED CONDUCTING LID

[75] Inventors: Gerald Z. Yin, Cupertino; Hiroji Hanawa, Santa Clara; Diana X. Ma, San Jose; Donald Olgado, Mountain View, all of Calif.

[73] Assignee: Applied Materials, Santa Clara, Calif.

[21] Appl. No.: 277,531

[22] Filed: Jul. 18, 1994

[51] Int. Cl.[6] .............................. C23F 1/00; C23C 16/00; C23C 14/34

[52] U.S. Cl. .............................. 204/298.34; 204/298.31; 204/298.33; 156/345; 118/732 E; 118/723 I; 118/723 IR

[58] Field of Search .................. 156/345; 204/290.31, 204/298.33, 298.34, 298.39; 118/723 E, 723 ER, 723 I, 723 IR

[56] References Cited

U.S. PATENT DOCUMENTS

| | | | |
|---|---|---|---|
| 4,464,223 | 8/1984 | Gorin | 156/345 |
| 4,795,529 | 1/1989 | Kawasaki et al. | 156/345 |
| 4,842,683 | 6/1989 | Cheng et al. | 156/345 |
| 4,844,775 | 7/1989 | Keeble | 204/192.32 |
| 4,872,947 | 10/1989 | Wang et al. | 156/345 |
| 4,948,458 | 8/1990 | Ogle | 156/345 |
| 4,992,665 | 2/1991 | Mohl | 315/111.81 |
| 5,122,251 | 6/1992 | Campbell et al. | 204/298.06 |
| 5,234,529 | 8/1993 | Johnson | 156/345 |
| 5,277,751 | 1/1994 | Ogle | 156/345 |
| 5,280,154 | 1/1994 | Cuomo et al. | 156/345 |
| 5,346,578 | 9/1994 | Benzing et al. | 156/345 |
| 5,368,710 | 11/1994 | Chen et al. | 204/192.32 |

FOREIGN PATENT DOCUMENTS

| | | |
|---|---|---|
| 0379828A2 | 8/1990 | European Pat. Off. . |
| 0379828A3 | 8/1990 | European Pat. Off. . |
| 0520519 | 12/1992 | European Pat. Off. . |
| 0596551A1 | 5/1994 | European Pat. Off. . |
| 2231197 | 11/1990 | United Kingdom . |
| WO92/20833 | 11/1992 | WIPO . |

Primary Examiner—R. Bruce Breneman
Assistant Examiner—Rodney G. McDonald
Attorney, Agent, or Firm—Michaelson & Wallace

[57] ABSTRACT

Capacitive coupling and RF power dissipation is advantageously reduced in the present invention by employing an RF coil having plural coil sections, each coil section connected across an RF source, commonly tapped ones of the coil sections being wound in opposite directions. Capacitive coupling and RF power dissipation is further reduced by employing a top lid having an outer insulating annulus and an inner conducting disk portion, the conducting disk portion being displaced or spaced apart from the coil by the width of the annulus. This displacement significantly reduces the RF power dissipation or coupling from the top winding of the coil to the lid. Furthermore, the plural coil sections or mirror coil configuration reduces sputtering of insulative material induced by capacitive RF coupling.

31 Claims, 8 Drawing Sheets

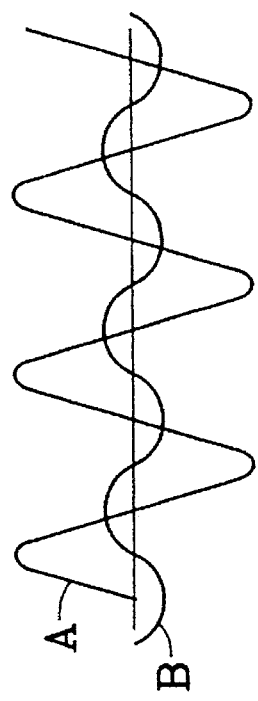
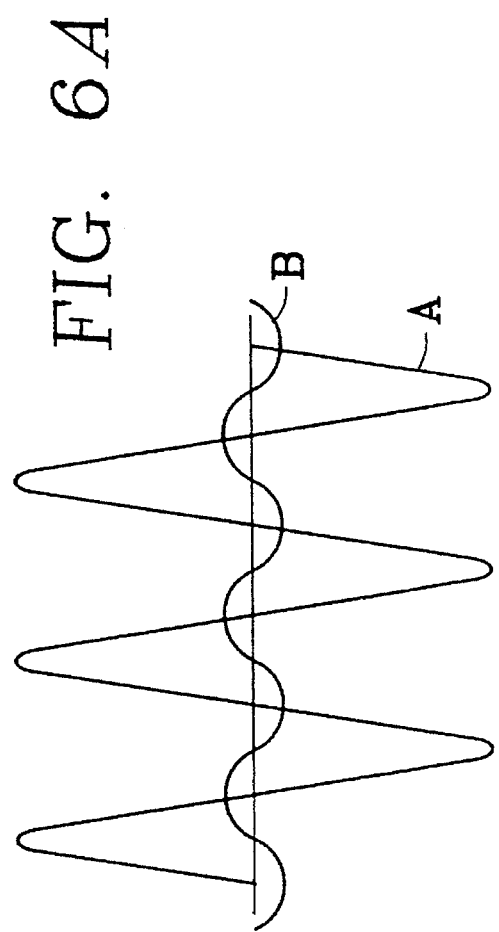
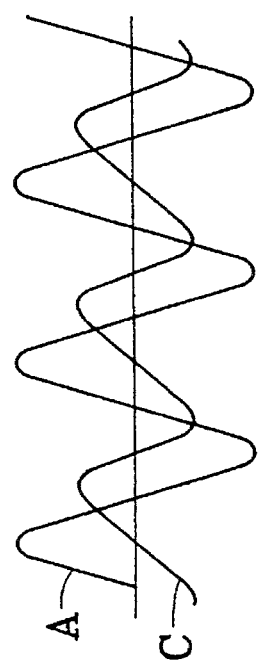
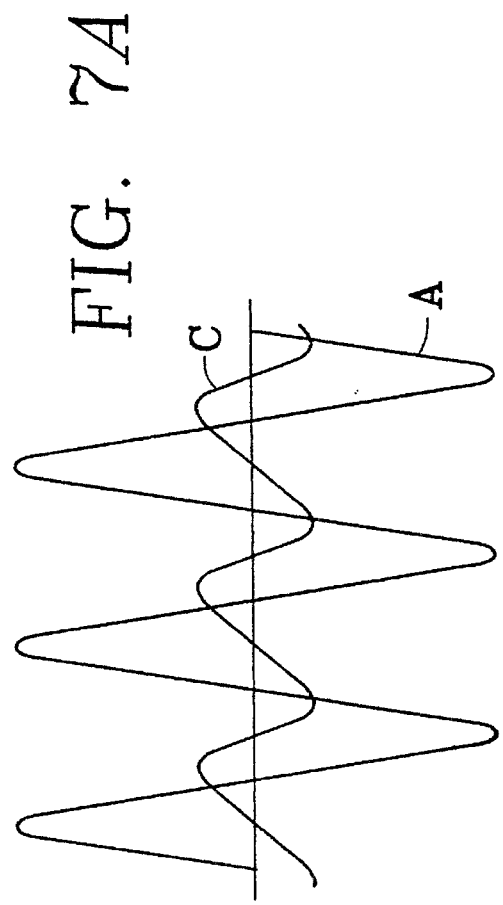
FIG. 6A
FIG. 6B
FIG. 7A
FIG. 7B

PLASMA REACTOR WITH MULTI-SECTION RF COIL AND ISOLATED CONDUCTING LID

BACKGROUND OF THE INVENTION

1. Technical Field

The invention is related to plasma reactors for processing semiconductor wafers of the type having a vacuum chamber, an inductive RF coil wound around the upper portion of the chamber and a wafer pedestal which may be capacitively RF powered.

2. Background Art

An inductively coupled RF plasma reactor for processing semiconductor wafers generally includes a vacuum chamber, an inductive RF coil wound around the upper portion of the chamber, a gas supply inlet for furnishing gas to the chamber interior and a wafer pedestal which may be capacitively RF powered. One example is disclosed in U.S. Pat. No. 4,948,458 to Ogle. The upper portion of the chamber including the chamber top has a certain area made of insulator material so that RF power from the RF coil can inductively couple into the plasma inside the chamber. The upper portion of the vacuum chamber may be a cylinder while the top may be a flat disk. The cylinder is an insulator with the inductive RF coil wound around it. The flat top of the chamber may be a conductor.

FIG. 1A illustrates a top portion of a plasma reactor of the type disclosed in European Patent Document No. 0 520 519 A1 and in European Patent Document No. 0 552 491 A1, the disclosures of which are incorporated herein by reference. The plasma reactor of FIG. 1A has a generally cylindrical vacuum chamber 10, a gas inlet 11 on top of the chamber 10 for supplying a gas into the chamber interior from which a plasma is to be ignited, a cylindrical RF coil 12 wound around the exterior of the cylindrical chamber 10, a grounded top conducting lid 14 immediately above the coil 12 and a grounded side wall 16 immediately below the coil 12. The cylindrical RF coil 12 provides RF energy to generate a high density plasma inside the chamber 10 by inductive coupling while the conductive lid 14 is grounded to assure a grounding path for bias RF power (17) applied to a pedestal 18 supporting a semiconductor wafer 20 at the bottom of the chamber 10. One end 12a of the cylindrical coil 12 (e.g., the end nearest the lid) is "hot" because it is connected to the output of an RF source 22, while the opposite end is grounded. In FIG. 6 and FIG. 8 of European Patent Document No. 0 552 491, the coil may be a single section tapped near its center to the RF source.

FIG. 1B illustrates a recent variation from the apparatus of FIG. 1A in which the ceiling 14 is an insulator and both the ceiling 14 and the RF coil 12 have a dome shape, the RF coil 12 being wound in a conical helix to conform with the ceiling 14, as shown in FIG. 1C.

One problem with such a plasma reactor is that the close proximity of the grounded lid 14 to the "hot" end of the cylindrical coil 12 of FIG. 1A or conical helix coil 12 of FIG. 1B permits significant dissipation of the RF power from the coil 12 to the grounded lid 14. Alternatively, if the bottom end of the coil 12 is "hot" and the top end is grounded, then RF power is dissipated from the coil 12 to the grounded side wall 16. As a result, the required RF power level for the cylindrical coil 12 is on the order of 2 to 3 watts, which is comparatively high. Because of the need to ground the lid 14 above the coil 12 and the side wall 16 below the coil 12, such RF power dissipation from the coil 12 has seemed to be unavoidable.

The problem with the inductive RF coil having one end grounded and one end RF powered is that the RF peak-to-peak potential within the coil is very high and this causes strong capacitive coupling of RF power into the plasma. The high electric potential also causes a significant sputtering of chamber interior surfaces. Such sputtering is undesireable because it produces contamination harmful to the processing of the wafer.

The RF potential within the coil also affects capacitive coupling of RF power from the coil to the wafer pedestal through the semiconductor wafer being processed. A high RF potential may cause a high plasma potential so as to increase the rate of physical sputtering of the wafer being processed. It is desired to control the sputtering rate of the wafer being processed by the RF bias power applied to the wafer pedestal. However, such control is distorted to a certain extent by the high capacitive coupling from the RF coil. As employed herein, the term sputtering of the wafer refers to the removal of material from the wafer through the kinetic energy of heavy ions in the plasma colliding with the material being removed. This is different from the removal of material from the wafer by etching. Etching involves a chemical reaction between the material being removed and chemical species in the plasma and is not primarily dependent upon kinetic energy of ions or radicals in the plasma. Sputtering can have beneficial uses in an etch process. For example, in etching a metal such as aluminum, alloy impurities in the aluminum (such as copper) etch very slowly relative to the aluminum and are best removed at the same rate as the aluminum by sputtering. This requires that the RF potential of the wafer pedestal be set to a level such that the sputtering rate of the copper impurity is about the same as the ethc rate of the aluminum, in this example.

SUMMARY OF THE INVENTION

Capacitive coupling from the RF coil and RF power dissipation are advantageously reduced in the present invention by employing plural coil sections, with each coil section being connected across an RF source and being arranged so that current flow in adjacent coil sections creates magnetic fields having the same direction. Preferably, this is accomplished by winding adjacent coil sections in opposing directions while tapping the adjacent coil sections to a common point which is either the RF source or ground. Capacitive coupling and RF power dissipation is further reduced by employing a top lid having an outer insulating annulus and an inner conducting disk portion, the conducting disk portion being displaced or spaced apart from the coil by the width of the annulus. This displacement significantly reduces the RF power dissipation or coupling from the top winding of the coil to the lid.

BRIEF DESCRIPTION OF THE DRAWINGS

FIG. 6A is a graph illustrating the time domain waveform of the RF signal on the conventional RF coil of FIG. 1C and the induced capacitive RF current on the wafer pedestal prior to plasma ignition.

FIG. 6B is a graph illustrating the time domain waveform of the RF signal on the mirror RF coil of FIG. 2C and the induced capacitive RF current on the wafer pedestal prior to plasma ignition.

FIG. 7A is a graph illustrating the time domain waveform of the RF signal on the conventional RF coil of FIG. 1C and the induced RF current on the wafer pedestal following plasma ignition.

FIG. 7B is a graph illustrating the time domain waveform of the RF signal on the mirror RF coil of FIG. 2B and the induced RF current on the wafer pedestal following plasma ignition.

DETAILED DESCRIPTION OF THE PREFERRED EMBODIMENT

Figure 2C:
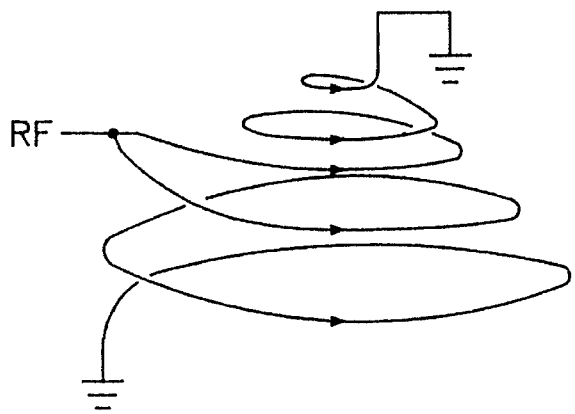
FIG. 2C illustrates the RF coil of FIG. 2B.
Figure 2D:
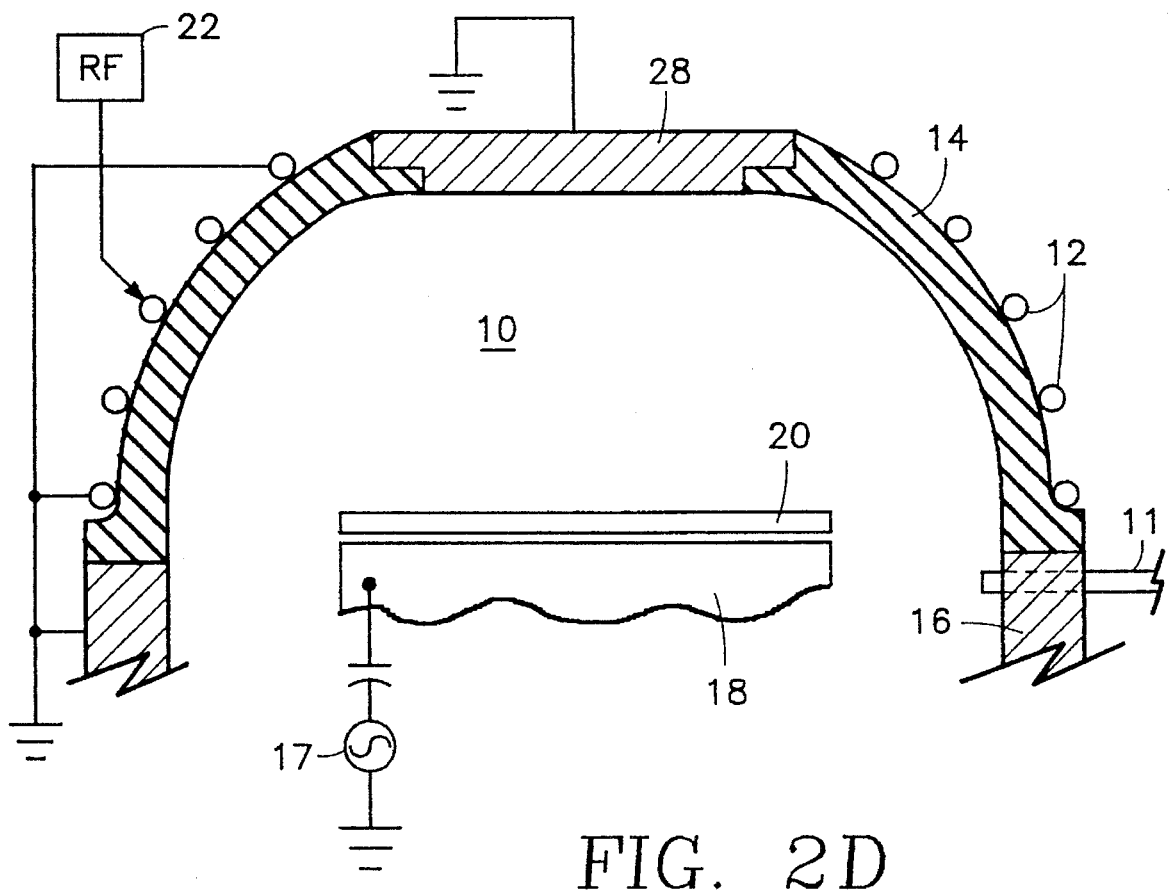
FIG. 2D illustrates a variation of the embodiment of FIG. 2B
Figure 2A:
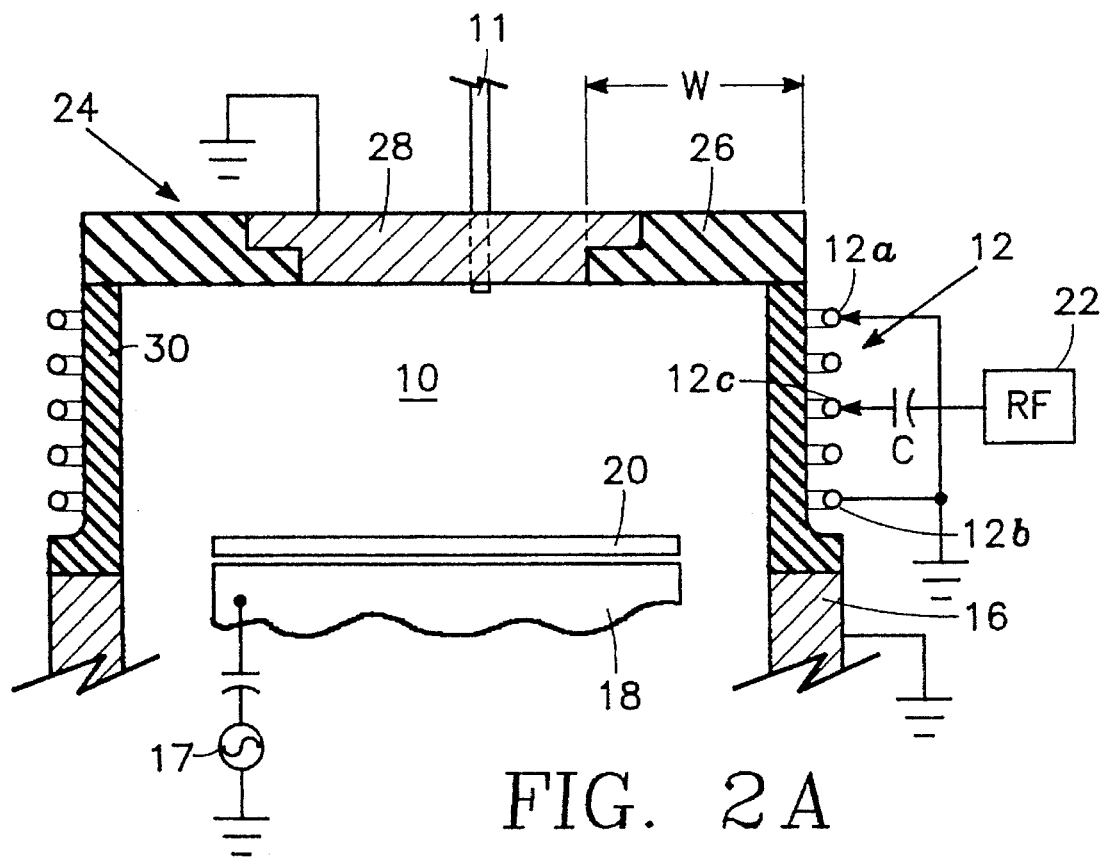
FIG. 2A is a simplified drawing of a portion of a plasma reactor embodying the present invention.

Referring to FIG. 2A, RF power dissipation is advantageously reduced by a top lid 24 having an outer insulating annulus 26 and an inner conducting disk portion 28, the conducting disk portion 28 being displaced or spaced apart from the coil 12 by the width W of the annulus 26. This displacement reduces the RF power dissipation or coupling from the top winding of the coil 12 to the lid 24, particularly where the top end 12a of the coil is connected to the RF source 22.

Figure 3:
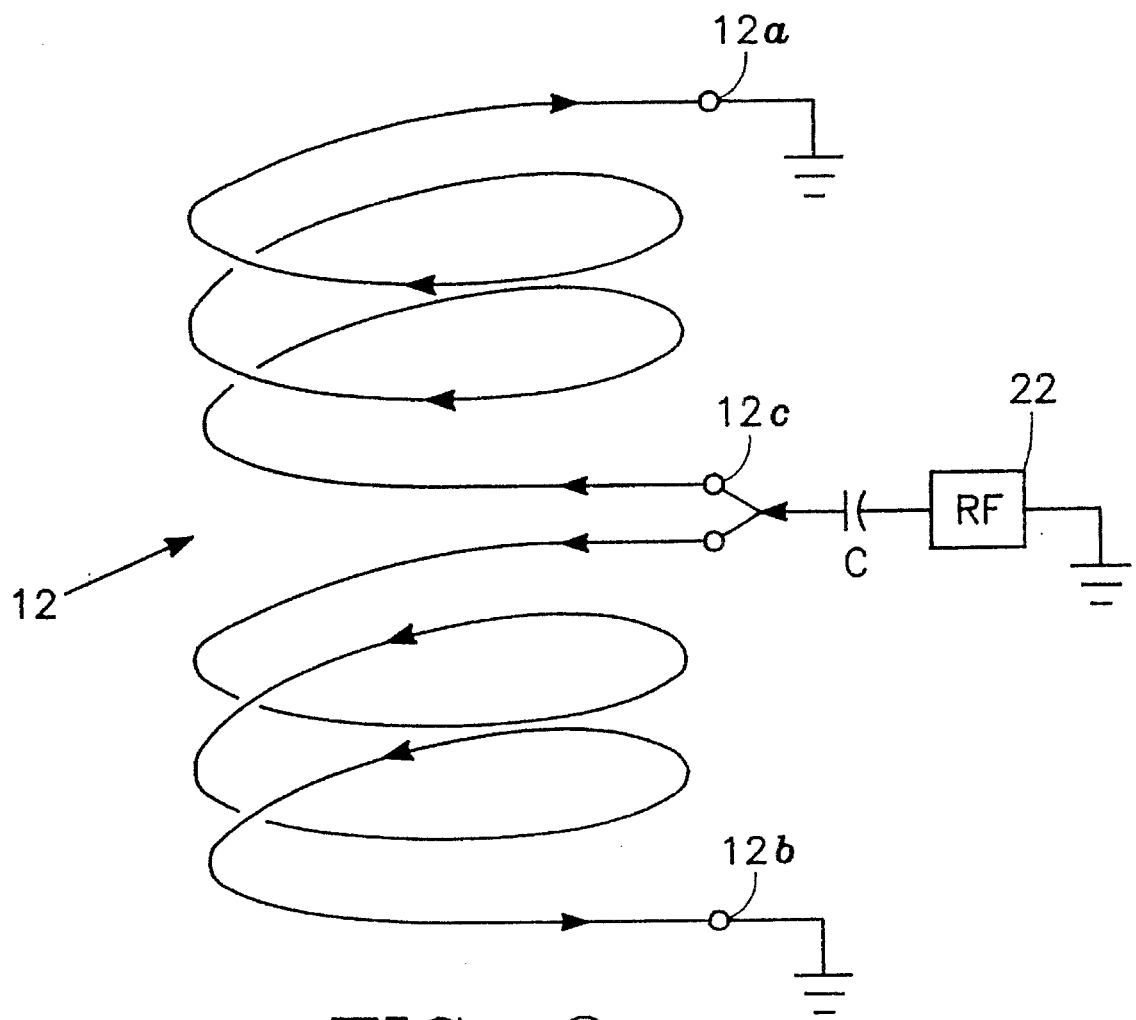
FIG. 3 is a circuit diagram of a mirror coil employed in the plasma reactor of FIG. 2A.

RF power dissipation is further reduced by grounding the top and bottom ends 12a, 12b of the coil 12 and connecting the RF power source to the middle 12c of the coil in a mirror configuration, as indicated in FIG. 2A and as shown more clearly in the circuit diagram of FIG. 3. In this way, the "hot" portion of the coil 12 is neither adjacent the grounded conductive portion 28 of the lid 24 nor the grounded lower-most portion of the side wall 16, so that RF power dissipation is reduced accordingly.

Figure 1A:
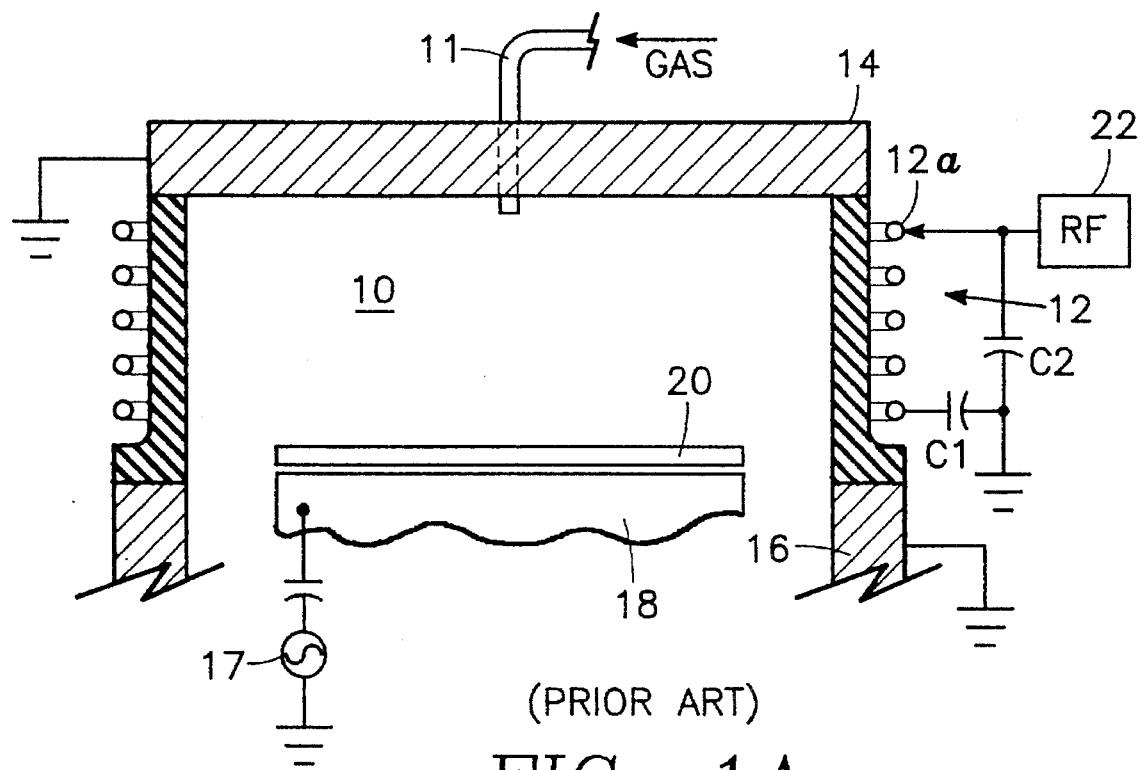
FIG. 1A is a simplified drawing of a portion of the plasma reactor of the prior art.
Figure 1B:
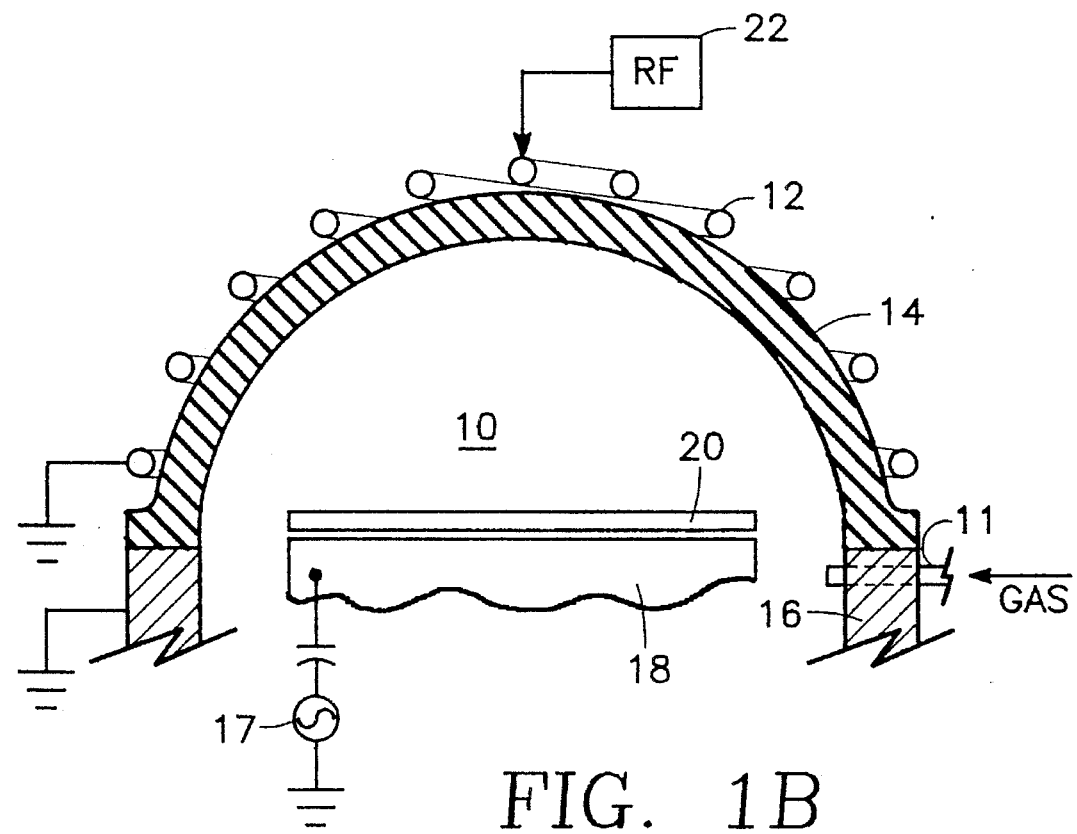
FIG. 1B is a simplified drawing of a portion of a plasma reactor in accordance with a recent development having a dome ceiling and conically helical RF coil on the ceiling.
Figure 1C:
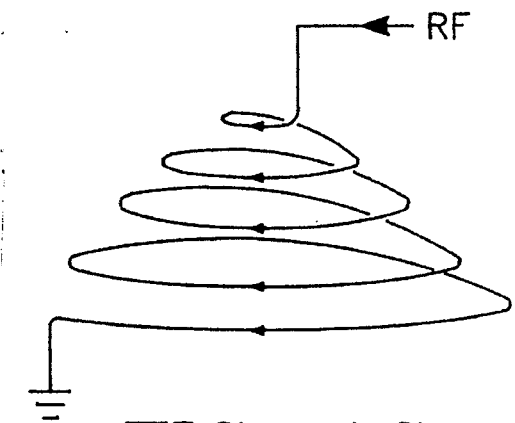
FIG. 1C illustrates the RF coil of FIG. 1B.
Figure 2B:
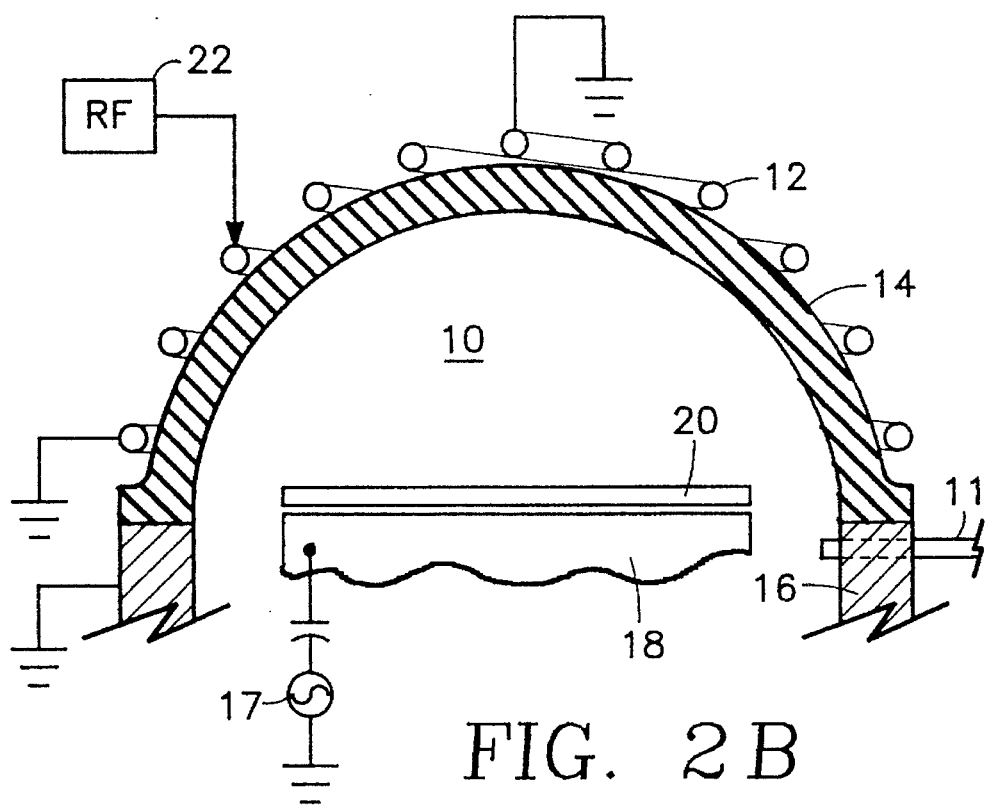
FIG. 2B illustrates an embodiment corresponding to FIG. 2A but having a dome-shaped lid and RF coil wound thereabout.

FIG. 2B illustrates how the concept of FIG. 2A is applied to the dome-ceiling plasma reactor of FIG. 1B. As in FIG. 1B, the ceiling 14 is an insulator. As in the embodiment of FIG. 2A, in FIG. 2B the RF power is applied to the middle winding of the coil 12, while the two ends are grounded, as illustrated schematically in FIG. 2C. In many cases, this feature tends to advantageously reduce capacitive coupling to the conductive cylindrical side wall 16. Moreover, in many cases grounding the apex of the dome-shaped RF coil 12 of FIG. 2B in the manner illustrated tends to reduce capacitive coupling of the electric field between the coil and the wafer, thereby advantageously increasing inductive coupling. FIG. 2D illustrates how the embodiment of FIG. 2B may be modified by replacing the center of the dome 14 with the flat conductive ceiling 28 of FIG. 2A, the coil 12 having an opening therein over the center so that no coil windings overlie the conductive ceiling 28.

In a preferred implementation of the embodiment of FIG. 2A, the coil 12 has five windings and the power source 22 applies an RF signal of 2.0 MHz to the middle winding 12c of the coil 12, as disclosed in the above-referenced European Patent Document. Furthermore, all of the operating parameters are as disclosed in detail in the above-referenced European Patent Document and need not be reiterated herein.

In a preferred implementation, the plasma reactor of FIG. 2A processes 8-inch diameter semiconductor wafers, the cylindrical reactor chamber 10 has a diameter of about 14 inches, the conductive disk portion 28 has a diameter of about 8 inches so that the width W of the insulating annulus 26 is about 6 inches. The insulating annulus 26 is preferably made of a ceramic such as aluminum oxide or quartz while the conductive disk portion 28 and the conductive side walls 16 are made of anodized aluminum. The coil 12 is wound around an insulating cylindrical side wall portion 30 disposed between the lid 24 and the conductive lower portion of the side wall 16. The vertical height of the insulating cylindrical side wall portion 30 is about 3.75 inches. The insulating side wall portion is preferably made of aluminum oxide or quartz.

Figure 4:
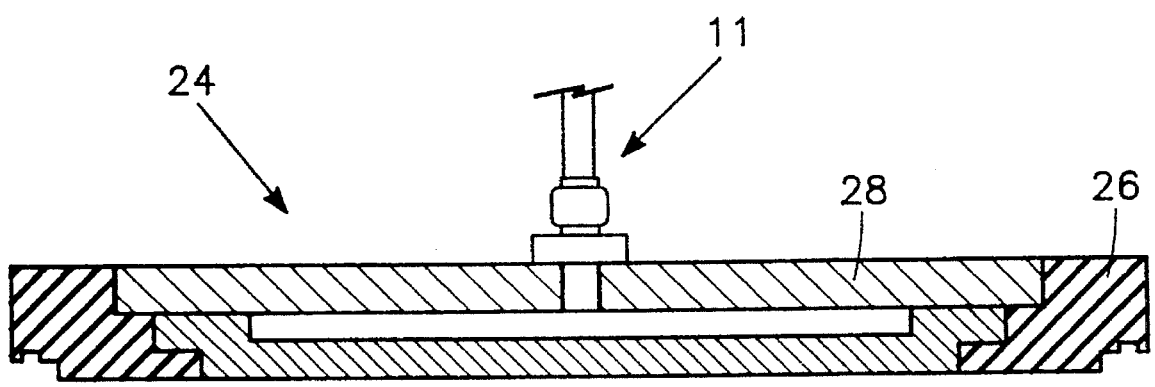
FIG. 4 is a detailed drawing of a preferred implementation of a conducting lid embodying one aspect of the present invention.

FIG. 4 illustrates a preferred design of the lid 24 of FIG. 2A. The gas inlet 11 extends through an axial hole in the center of the conductive disk portion 28 of the lid into a gas distribution manifold of which the conductive disk portion 28 is the ceiling. The conductive disk portion 28 is seated on an annular ridge of the insulating annulus 26.

Figure 5:
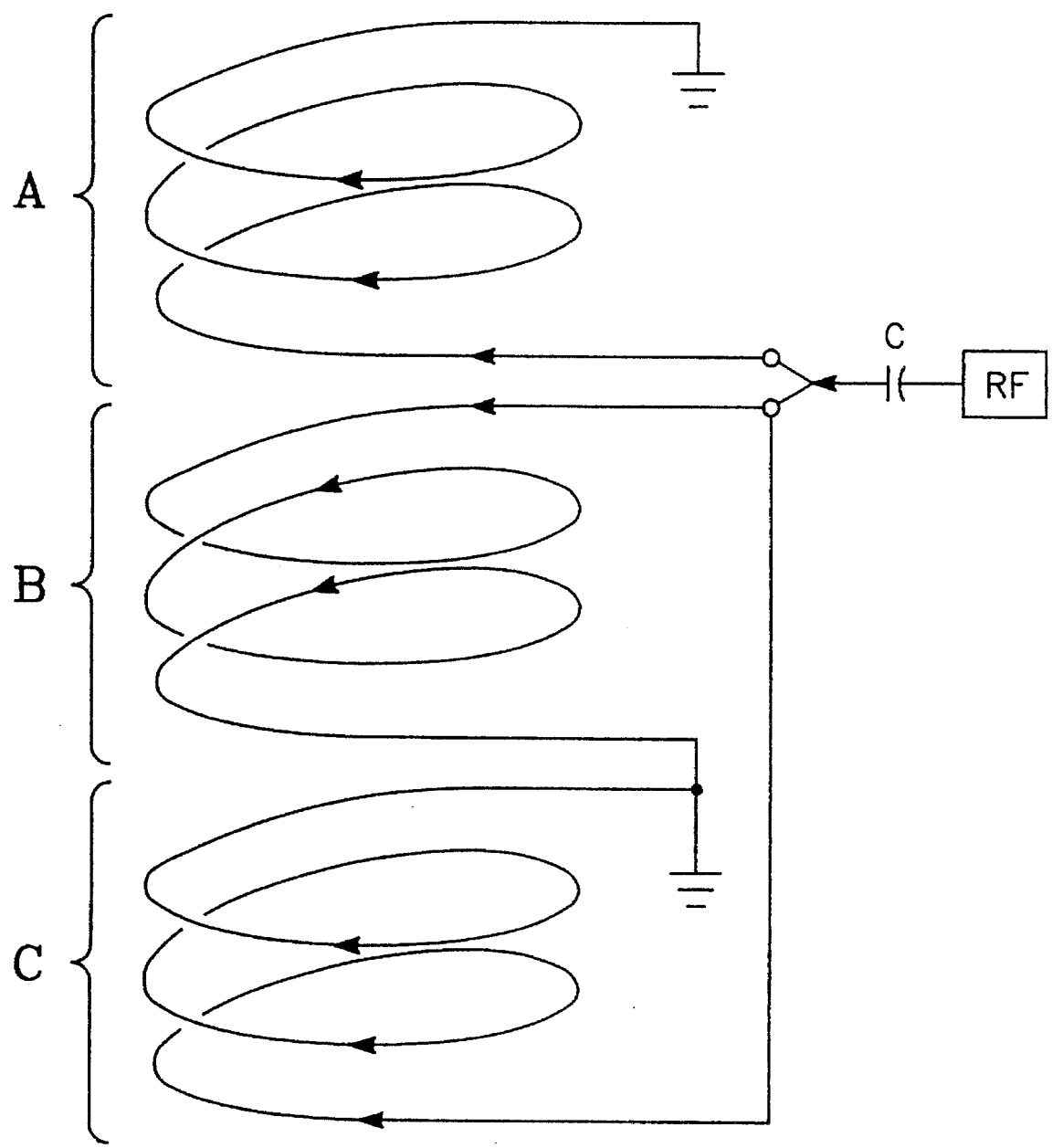
FIG. 5 is a schematic diagram of a three-section coil in accordance with another embodiment of the invention.

While FIG. 3 illustrates an embodiment in which the coil 12 constitutes two groups of coils connected in parallel to the RF source 22, RF power can be delivered to n groups of inductive coils, where n is an integer greater than 1. Each group of coils has a certain number of turns, which number may not be the same from group to group. For example, FIG. 5 illustrates a coil for n=3 to be used in place of the coil 12 of FIG. 1A. An advantage of having more than one group of coils in the coil 12 is that capacitive coupling to the plasma is significantly reduced for a given applied RF power level as compared to a single inductive coil configuration. For example, the single inductive coil configuration (corresponding to FIG. 1A) with seven coil turns was observed to have a voltage drop across the coil of 6 kV RMS for an applied power level of 2 kW, with the capacitor $C_1$ having 2000 picoFarads capacitance and the capacitor $C_2$ having 275 picoFarads capacitance. In contrast, at the same applied RF power level (2 kW), the mirror coil of FIGS. 2 and 3 (n=2) with three coil turns in each of the two groups exhibited a voltage drop of only 3 kV RMS and 2 kV RMS, respectively.

As stated above with reference to FIG. 3, the RF inductive coil 12 is preferably separated into n parallel plural coil sections, where n is an integer greater than 1 (e.g., 2, 3, 4, ... etc.) as illustrated in FIGS. 2C, 3 and 5. If the RF coil 12 has a cylindrical shape, the n coil sections are mirror images of one another. In all cases it is preferable that the n coil sections are wound such that current in all sections rotates in the same direction so as to produce magnetic fields having the same direction so as to reinforce each other in inductively coupling RF power to the plasma. Preferably, this is accomplished whenever adjacent coils are connected to a common tap point (i.e., the RF source) by winding adjacent coil sections in opposite directions, as in FIGS. 2C, 3 and 5.

Referring to FIG. 3 for example, current flow through the upper coil section from the common tap point 12c to the coil end 12a is upward while current flow is downward through the lower coil section from the common tap point 12c to coil end 12b. However, rotation of the current through the coil loops is in the same rotational direction in both sections because the two coil sections are wound in opposite directions. Thus, the magnetic fields produced by both coil sections have the same polarity and reinforce each other.

Referring to FIG. 5 in which there are three coil sections labelled "A", "B" and "C" for the case n=3, the upper two coil sections "A" and "B" correspond to the two coil sections of FIG. 3, consisting of coiled conductors wound in opposite rotational directions. The lower coil section in FIG. 5 labelled "C" adjacent the coil section "B" is wound in the rotational direction of coil section "A" and is connected between the grounded lower end of coil section "B" and the common tap between coil sections "A" and "B" to which the RF source is connected.

In general, for n>2, the plural coil sections are grouped by pairs of coil sections, each coil section being within two adjacent pairs of coil sections, each pair of coil sections having a common tap to one end of each coil section in the pair, coil sections within each of pair being wound in opposite directions, the common taps of alternate ones of the pairs being connected to the RF power terminal and the common taps of remaining ones of the pairs being connected to RF ground. Thus, for example, in FIG. 5, the coil sections labelled "A" and "B" are one pair having a common tap connected to the RF source, the coil sections labelled "B" and "C" are a second pair having a common tap connected to RF ground, the coil sections in each pair being wound in opposite rotational directions.

FIGS. 6A and 6B indicate the induced AC voltage (waveform "A") and current (waveform "B") on the cathode or wafer pedestal in the absence of a plasma by the conventional and mirror coils, respectively, under the following conditions: chamber pressure is pumped down to the desired or baseline operating pressure, there is no gas flow and there is no plasma. The AC current induced on the wafer pedestal (an indicia of capacitive coupling) by the mirror coil (FIG. 6B) is lower than the AC current induced by the conventional coil (FIG. 6A). However, the absolute value is too small to measure.

FIGS. 7A and 7B indicate the AC voltage (waveform "A") and current (waveform "B") induced on the wafer pedestal by a conventional coil and the mirror coil, respectively, with Argon gas present in the vacuum chamber and the plasma ignited. The AC current induced on the wafer pedestal by the mirror coil is about 15% less than that induced by the conventional coil, indicating less capacitive coupling with the mirror coil. This is a significant advantage because less capacitive coupling from the mirror coil means that more RF energy is being coupled inductively to generate a plasma with greater density, and the user is better able to control or reduce the ion energy or sputtering rate by varying RF power on the the wafer pedestal. The AC current measured during such tests may not necessarily arise from capacitive coupling alone, but may arise from a mixture of both capacitive and inductive coupling.

Figure 8:
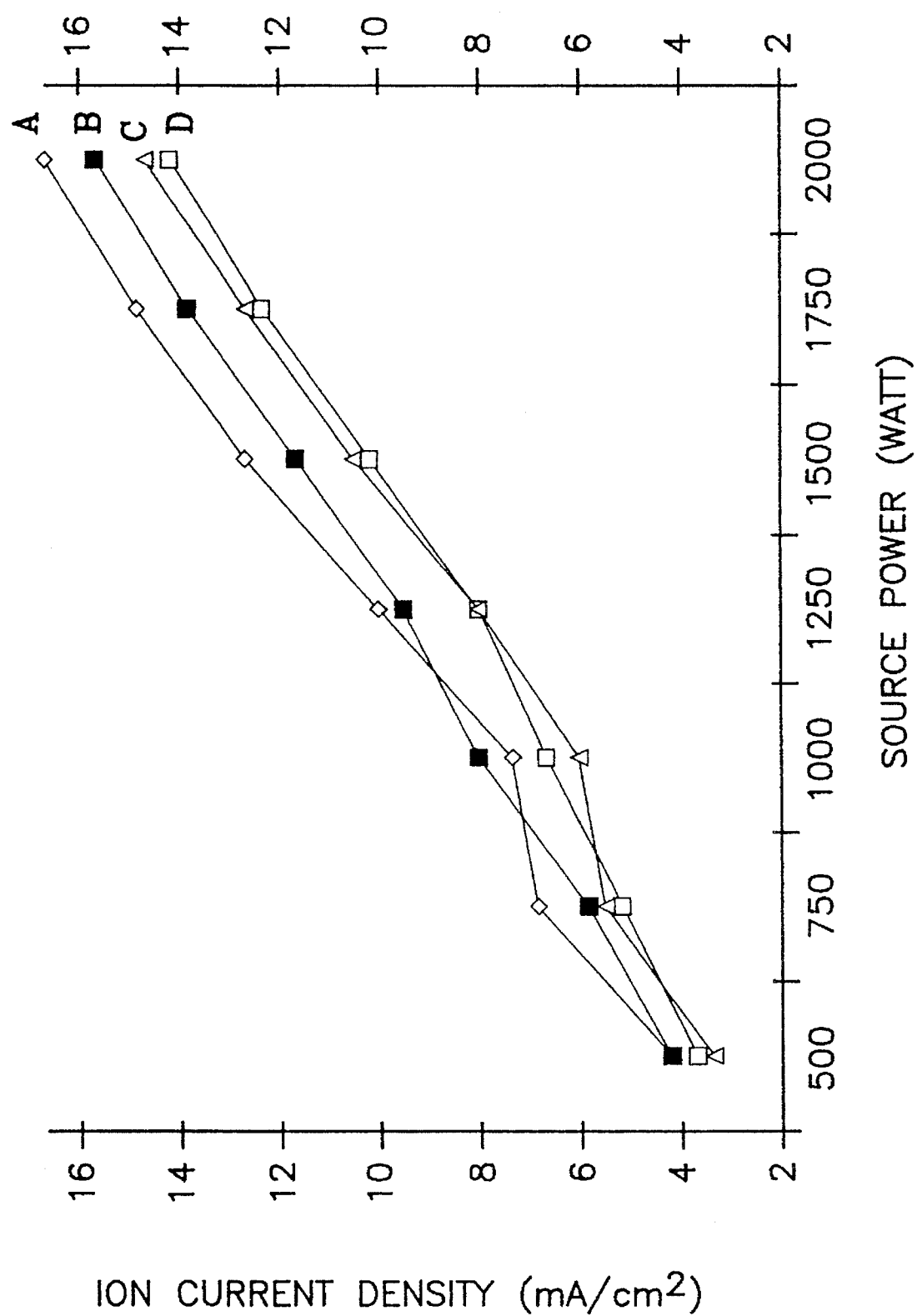
FIG. 8 is a graph comparing the ion current density obtained with conventional RF coil of FIG. 1C with the ion current density obtained with the mirror RF coil of FIG. 2C as a function of RF power on the coil.

FIG. 8 compares the ion current densities with respect to the RF power obtained from a conventional RF coil with that obtained from a mirror coil. The curve labelled "A" and having diamond markers represents measurements at the edge of a conventional coil. The curve labelled "B" and having black solid square markers represents measurements in the center of the mirror coil. The curve labelled "C" and having triangle markers represents measurements at the edge of the conventional coil. The curve labelled "D" and having white square markers represents measurements at the edge of the mirror coil. There is no noticeable difference in these measurements between the mirror coil and the conventional coil, due to large random variations. Both the conventional coil and the mirror coil are of cylindrical shapes in this comparison.

Figure 9:
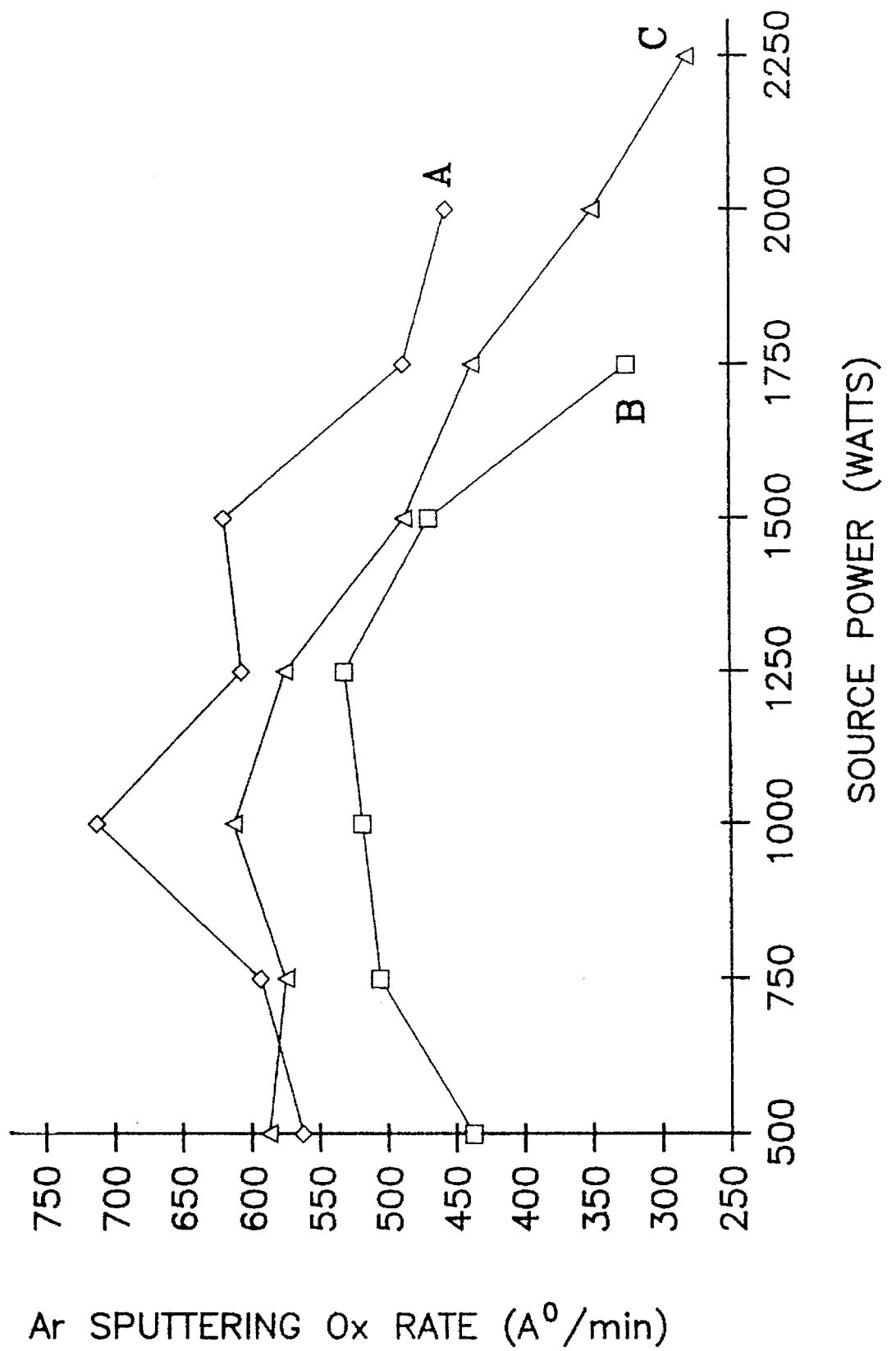
FIG. 9 is a graph comparing oxide sputtering rates obtained with the conventional RF coil of FIG. 1C with the oxide sputtering rates obtained with the mirror RF coil of FIG. 2C as a function of RF power on the coil in an Ar plasma at 600 watts RF bias power on the wafer pedestal.

FIG. 9 compares the oxide sputtering rate in an Argon plasma as a function of RF power obtained from a conventional RF coil with that obtained from a mirror coil. The curves labelled "A" and "C" with diamond and triangle markers respectively represent measurements from two different tests of the mirror coil. The curve labelled "B" with the square markers represents measurements on a conventional coil. As in the comparison of FIG. 8, there is no noticeable difference due to large random variations. In the test of FIG. 9, a 600 Watt RF bias signal was applied to the wafer pedestal. The sputtering rate predominantly depends upon the RF bias power applied to the wafer pedestal, not the RF power capacitively coupled from the RF coil. Such capacitive coupling should be significantly reduced in the mirror coil, a significant advantage as explained above.

The foregoing comparisons involved only the mirror coil embodiment of the invention, in which n=2. However, it should be noted that for all other embodiments of the invention, in which n>2, these advantages generally are more pronounced because there is an even greater division of the potential in the coil.

Another advantage realized in the present invention relates to the sputtering of materials from the chamber interior surfaces. It is very common to operate the source RF power at a very high level (e.g., 2–3 kW with 5 kV to 6 kV peak-to-peak voltage). At such high voltage levels, the plasma tends to sputter the chamber materials at significant sputtering rates. However, the mirror coil or the plural section coil reduces the peak-to-peak voltage. This reduces the chamber material sputtering rate, thus reducing the rate of contamination of the wafer due to emanation of particles from the sputtering of the chamber wall. This also minimizes device damage on the wafer being processed resulting from such a high RF potential.

While the invention has been described in detail by specific reference to preferred embodiments, it is understood that variations and modifications thereof may be made without departing from the true spirit and scope of the invention.

What is claimed is:

1. A plasma reactor comprising:

a vacuum chamber having an at least partially insulating upper portion;

an RF power source having an RF power terminal and a return terminal connected to an RF ground;

an RF inductor coil wound around said insulating upper portion, said RF inductor coil comprising plural coil sections each connected across said RF power terminal and said RF ground, each one of said coil sections being wrapped around said insulating upper portion, at least a pair of said coil sections being connected at respective ends thereof through a common tap point to said RF power terminal and each coil section of said pair being wound in opposite rotational directions;

means for supplying a gas into said chamber;

a wafer pedestal in said chamber for supporting a wafer to be processing inside said chamber.

2. The reactor of claim 1 wherein said insulating upper portion comprises a top cylindrical side wall portion, said chamber further comprising a lower conductive cylindrical side wall portion.

3. The reactor of claim 2 further comprising a ceiling overlying said top cylindrical side wall portion, said ceiling having a conductive center portion and an insulating annular portion adjacent said cylindrical side wall and surrounding said conductive center portion.

4. The reactor of claim 3 wherein said respective ends of said coil sections are adjacent respective ones of said conductive lower side wall portion, and wherein said conductive center portion of said ceiling and said lower conductive portion of said side wall are connected to said RF ground.

5. The reactor of claim 1 wherein said insulating upper portion comprises at least a first portion of a dome top of said chamber.

6. The reactor of claim 5 wherein said dome top comprises a second portion which is a conductive center section at an apex of said dome top and an insulating annulus surrounding said conductive center section, said RF inductor being wound only around said first portion of said dome top.

7. The reactor of claim 6 wherein said respective ends of said coil sections are adjacent respective ones of said conductive lower side wall portion and said second portion of said dome top, and wherein said conductive center section of said dome top and said lower conductive portion of said side wall are connected to said RF ground.

8. The reactor of claim 5 wherein said upper portion comprises the entire dome top and said RF inductor coil is wound around the entirety of said dome top.

9. The reactor of claim 1 wherein said RF inductor coil comprises a helically wound conductor having a pair of ends and a middle, said coil being divided into said two sections at said middle, and wherein said middle comprises said first terminals and said pair of ends comprises said second terminals.

10. The reactor of claim 9 wherein said helically wound conductor is wound in a cylinder shape and wherein said two sections are mirror coils.

11. The reactor of claim 1 wherein said insulating upper portion comprises a ceramic material.

12. The reactor of claim 11 wherein said ceramic material comprises aluminum oxide.

13. The reactor of claim 1 further comprising a third coil section connected at one end thereof to said RF ground at a second common tap point with an end of one of said pair of coil sections, said third coil section and said one of said pair of coil sections being wound in opposite directions.

14. The reactor of claim 1 wherein said plural coil sections comprise pairs of coil sections, a respective coil section being within two of said pairs of coil sections, each pair of coil sections having a common tap to one end of each coil section in the pair of coil sections, coil sections within each of pair being wound in opposite directions, the common taps of alternate ones of said pairs being connected to said RF power terminal and the common taps of remaining ones of said pairs being connected to said RF ground.

15. A plasma reactor comprising:

a vacuum chamber having a containment wall;

means for introducing a gas into said vacuum chamber;

an RF source;

an RF coil wound around a first portion of said containment wall and comprising plural coil sections, at least two of said plural coil sections being wound in opposite directions and having facing ends connected at a first common tap to said RF source and their other ends connected to ground.

16. The reactor of claim 15 further comprising a third coil section connected at one end thereof to ground at a second common tap point with an end of one of said pair of coil sections, said third coil section and said one of said pair of coil sections being wound in opposite directions.

17. The reactor of claim 15 wherein said plural coil sections comprise pairs of coil sections, a respective coil section being within two of said pairs of coil sections, each pair of coil sections having a common tap to one end of each coil section in the pair of coil sections, coil sections within each of pair being wound in opposite directions, the common taps of alternate ones of said pairs being connected to said RF source terminal and the common taps of remaining ones of said pairs being connected to ground.

18. The plasma reactor of claim 15 wherein there are two coil sections and said coil is connected to said RF source in a mirror configuration.

19. The plasma reactor of claim 15 wherein said first portion of said containment wall comprises a cylindrical side wall having a conductive section thereof below said coil and a lid above said coil, said lid having a conductive portion thereof spaced apart from said cylindrical side wall, a remaining portion of said lid between said conductive portion and said side wall being insulative.

20. The plasma reactor of claim 19 wherein said conductive portion of said lid and said conductive section of said side wall are both connected to an RF return node of said RF source.

21. The plasma reactor of claim 20 wherein said RF return node is a ground node.

22. The plasma reactor of claim 15 wherein said first portion of said containment wall comprises a dome-shaped lid, and another portion of said containment wall comprises a conductive side wall.

23. The plasma reactor of claim 22 wherein said coil is wound as a conical helix conforming with said dome-shaped lid, and wherein said coil being connected in a mirror configuration to said RF source.

24. The plasma reactor of claim 23 wherein an upper one of said sections has an end at the apex of said dome-shaped lid, said end being connected to an RF return node of said RF source.

25. The plasma reactor of claim 22 wherein said dome-shaped lid is comprised of insulative material.

26. The reactor of claim 24 wherein each section has a pair of ends, one end being connected to said RF source and the other end connected to an RF return node of said RF source.

27. The reactor of claim 26 wherein there are two of said sections, and said RF coil comprises a helically wound conductor having a pair of ends and a middle, said coil being divided into said two sections at said middle, and wherein said middle is connected by a conductor to said RF source and wherein said pair of ends are both connected to an RF return node of said RF source.

28. A plasma reactor, comprising:

a vacuum chamber shell comprising two conductive shell sections and an insulating shell section between said two conductive shell sections, said two conductive shell sections being connected to a return conductive path;

means for introducing a processing gas into said vacuum chamber;

an RF coil antenna wound around said insulating shell section and having at least two coil ends adjacent respective ones of said two conductive shell sections, said two coil ends being connected to said return conductive path so as to be at the same electrical potential as said two conductive shell sections; and an RF power source having a power terminal connected to said RF coil antenna at a point intermediate said two coil ends and an RF return terminal connected to said return conductive path;

wherein said RF coil antenna is wound in a first direction from one of said two coil ends to said point intermediate said two coil ends and is wound in an opposite direction from the other of said two coil ends to said point intermediate said two coil ends.

29. The reactor of claim 28 wherein said return path is RF ground.

30. A plasma reactor, comprising:

a vacuum chamber shell comprising a conductive shell section and an insulating shell section adjacent said conductive shell section, said conductive shell section being connected to a return conductive path;

means for introducing a processing gas into said chamber;

an RF coil antenna wound around said insulating shell section and having two coil ends, one of said two coil ends being adjacent said conductive shell section, said two coil ends being connected to said return conductive path so that said one coil end is at the same electrical potential as said conductive shell section; and an RF power source having a power terminal connected to said RF coil antenna at a point intermediate said two coil ends and an RF return terminal connected to said return conductive path;

wherein said RF coil antenna is wound in a first direction from one of said two coil ends to said point intermediate said two coil ends and is wound in an opposite direction from the other of said two coil ends to said point intermediate said two coil ends.

31. The reactor of claim 30 wherein said return path is RF ground.

* * * * *